(12) United States Patent
Vanagas et al.

(10) Patent No.: US 10,916,461 B2
(45) Date of Patent: Feb. 9, 2021

(54) METHOD OF LASER SCRIBING OF SEMICONDUCTOR WORKPIECE USING DIVIDED LASER BEAMS

(71) Applicant: EVANA TECHNOLOGIES, UAB, Vilnius (LT)

(72) Inventors: Egidijus Vanagas, Vilniaus raj. sav. (LT); Dziugas Kimbaras, Vilnius (LT); Laurynas Veselis, Klaipeda (LT)

(73) Assignee: EVANA TECHNOLOGIES, UAB, Vilnius (LT)

( * ) Notice: Subject to any disclaimer, the term of this patent is extended or adjusted under 35 U.S.C. 154(b) by 692 days.

(21) Appl. No.: 15/573,358

(22) PCT Filed: Jun. 1, 2015

(86) PCT No.: PCT/IB2015/054143
§ 371 (c)(1),
(2) Date: Nov. 10, 2017

(87) PCT Pub. No.: WO2016/193786
PCT Pub. Date: Dec. 8, 2016

(65) Prior Publication Data
US 2019/0139799 A1 May 9, 2019

(51) Int. Cl.
*H01L 21/67* (2006.01)
*B23K 26/067* (2006.01)
(Continued)

(52) U.S. Cl.
CPC .... *H01L 21/67282* (2013.01); *B23K 26/0006* (2013.01); *B23K 26/0626* (2013.01);
(Continued)

(58) Field of Classification Search
CPC ............ H01L 21/67282; H01L 21/268; H01L 21/67092; H01L 21/67115; H01L 21/78;
(Continued)

(56) References Cited

U.S. PATENT DOCUMENTS 7,486,705 B2* 2/2009 Shah ........................ G01J 11/00
372/25
9,138,913 B2* 9/2015 Arai ..................... B23K 26/083
(Continued)

FOREIGN PATENT DOCUMENTS

JP  2012086226 A  5/2012
JP  2012240082 A  12/2012

OTHER PUBLICATIONS

International Search Report and Written Opinion dated Apr. 26, 2016 for PCT Application No. PCT/IB2015/054143.

*Primary Examiner* — Galen H Hauth
(74) *Attorney, Agent, or Firm* — AAA Law

(57) ABSTRACT

This invention provides an effective and rapid method of laser processing for separating semiconductor devices formed on hard and solid substrates (6) with a one pass process. The method is based on generating fractures along the scribing trajectory which extend deep into the bulk of a workpiece (6), wherein thermal stress is induced by delivering at least two processing (ultra short pulse) pulsed-beams (7), containing at least primary and secondary pulses. Primary pulses are used to generate a heat accumulated zone, which allows for more efficient absorption of the secondary pulses, which generate a sufficient heat gradient to produce mechanical failures, necessary for mechanically separating the workpiece (6) into separate pieces.

9 Claims, 3 Drawing Sheets

(51) Int. Cl.
    *B23K 26/0622* (2014.01)
    *B23K 26/364* (2014.01)
    *B23K 26/53* (2014.01)
    *B23K 26/00* (2014.01)
    *B23K 26/06* (2014.01)
    *B23K 26/073* (2006.01)
    *H01L 21/268* (2006.01)
    *H01L 21/78* (2006.01)
    *H01L 23/544* (2006.01)
    *B23K 101/40* (2006.01)
    *B23K 103/16* (2006.01)
    *B23K 103/00* (2006.01)
    *H01L 29/18* (2006.01)
    *H01L 29/20* (2006.01)
    *H01L 29/16* (2006.01)

(52) U.S. Cl.
    CPC ........ *B23K 26/0676* (2013.01); *B23K 26/073* (2013.01); *B23K 26/53* (2015.10); *H01L 21/268* (2013.01); *H01L 21/67092* (2013.01); *H01L 21/67115* (2013.01); *H01L 21/78* (2013.01); *H01L 23/544* (2013.01); *B23K 2101/40* (2018.08); *B23K 2103/172* (2018.08); *B23K 2103/52* (2018.08); *B23K 2103/56* (2018.08); *H01L 29/1608* (2013.01); *H01L 29/2003* (2013.01); *H01L 2223/5446* (2013.01)

(58) Field of Classification Search
    CPC ... H01L 21/76; H01L 23/544; H01L 29/2003; B23K 26/364; B23K 26/53; B23K 26/0006; B23K 26/0626; B23K 26/073; B23K 26/0676; B23K 26/0624; B23K 26/0622; B23K 26/067
    See application file for complete search history.

(56) References Cited

U.S. PATENT DOCUMENTS

| | | |
|---|---|---|
| 2009/0032511 A1 | 2/2009 | Adams et al. |
| 2013/0128910 A1 | 5/2013 | Matsuda et al. |
| 2013/0256286 A1 | 10/2013 | Sercel et al. |
| 2014/0004639 A1 | 1/2014 | Sato |

* cited by examiner

METHOD OF LASER SCRIBING OF SEMICONDUCTOR WORKPIECE USING DIVIDED LASER BEAMS

FIELD OF INVENTION

The present method relates to laser material processing. More particularly it relates to methods and systems for separating hard and brittle semiconductor substrates or dies.

BACKGROUND OF INVENTION

Wafer dicing plays a critical role in the fabrication of semiconductor devices, devices which are becoming ever smaller and more complex. Silicon carbide (SiC) and gallium nitride (GaN) substrates are dedicated for new generation of high frequency (HF) communication and high power (HP) converter electronics. Production of such devices requires advanced die processing techniques to minimize the appearance of various internal and external defects in both the substrate and various functional layers (coatings), during wafer dicing (separation), as silicon carbide (SiC) and gallium nitride (GaN), both of them are an extremely hard materials. The process becomes more difficult as the initial wafers or substrates are coated with complex arrangements of functionalization layers, together with metal electrodes, and the material of the substrates is chosen to be of especially hard materials, as silicon carbide (SiC). In such cases there is a need for solutions that help to increase the processing rate as the functionalized surfaces have usually different physical properties other that the substrate and conventional "laser dicing" and similar techniques, which are most often used, can no longer be employed.

The U.S. Pat. No. 8,551,792 (B2), published 2013 Oct. 8, discloses a method of dicing a semiconductor wafer. The method comprises scribing at least one dielectric layer along dice lanes to remove material from a surface of the wafer using a laser with a pulse-width between 1 picosecond and 1000 picoseconds and with a repetition frequency corresponding to times between pulses shorter than a thermal relaxation time of the material to be scribed. The wafer is then diced through a metal layer and at least partially through a substrate of the semiconductor wafer.

The U.S. Pat. No. 6,562,698 (B2), published 2003 May 13, discloses a method for singulating semiconductor wafers comprises the steps of aiming a first and a second laser beam over a top surface of the substrate; forming scribe lines in the coating layer by scanning the first laser beam across the coating layer; and cutting through the substrate along the scribe lines with the second laser beam to form a respective kerf. The apparatus includes a first laser having a first wavelength placed over the coating layer of the substrate, and a second laser having a second wavelength different from that of the first laser placed over a surface of the substrate. The coating layer has a first absorption coefficient relative to a wavelength of the first laser and the semiconductor substrate has a second absorption coefficient less than the first absorption coefficient. Energy from the first laser beam is absorbed into the coating layer to form scribe lines therein, and the second laser beam cuts through the substrate along the scribe lines.

The Japan patent application No. JP2005116844 (A), published 2005 Apr. 28, discloses a method for manufacturing semiconductor device. The object of the invention is to reduce chipping while suppressing the generation of chipping and peeling on a surface layer of a workpiece even when the surface layer consists of a material different from that of a semiconductor substrate. The method includes a process for forming a groove by scanning the surface of a scribe line on which semiconductor elements are formed on a semiconductor substrate with a first laser light beam, converged on the surface of a scribe line, and a process for forming a reformed area, reformed by multiple photon absorption, by converging a second laser light beam on the inside of the semiconductor substrate along the first scribe line. It is claimed that since a surface groove is formed on the scribe line by the first laser light beam, the generation of chips or cracks can be suppressed independently surface of the semiconductor substrate and the semiconductor substrate can be easily cut off after forming the reformed area, employing multiple photon absorption by the second laser light.

Prior art methods impose limitations on substrate thickness, material type and processing quality used for wafer separation. In order to process hard and brittle materials, such as SiC or GaN, with a number of functionalized coatings, the above mentioned technologies require an increase in laser power or number of laser beam passes per separation line. Also, in some cases it is necessary to modify more than layers of the material. As a consequence, this has advert effects both to the semiconductor device performance and the yield of production.

SUMMARY

In order to eliminate the drawbacks indicated above, this invention provides an effective and rapid laser processing method for separating semiconductor devices formed on hard and solid substrates. During preparation of the device or substrate for the cleaving/breaking (dicing) procedure an area of damage (can also be referred to as "modification") is where a thermal stress induced crack or fracture extending from a first surface of a preferably planar workpiece along the intended trajectory of separation. The stress is induced by local thermal heating and subsequent cooling of the material with a one pass process, therefore increasing the yield of production. Henceforth the term "workpiece" will be defined to include the terms substrate, multilayered substrate, wafer, wafer sheet, device(s), or similar item that is prepared for processing and subsequent mechanical separation (breaking apart along dicing plains) and will be used interchangeable.

The invention discloses a semiconductor workpiece laser scribing method, wherein the workpiece comprises at least one substrate layer of a material having an energy bandgap in the range of 2.5 to 4 eV, wherein the workpiece has a first and second parallel surface and a pulsed beam laser radiation source is used, whereas the workpiece or processing laser beams are relatively translated along an intended scribing trajectory. The method is characterized in that it comprises steps of: forming at least two pulsed beams (processing pulsed beams) out of an initial beam provided by the pulsed beam laser source, containing at least primary and secondary pulses; delivering said pulses through converging means onto and into the workpiece, which is relatively translated with regard to the at least one primary and secondary pulsed beams. The pulses delayed by a time interval which slightly exceeds said substrate layer material electron-phonon relaxation time, in other words material lattice phonon absorption time, whereas the time interval is set to be from tens to hundreds of picoseconds, whereas primary pulses in the scribing area are used to initiate and maintain surface ablation and heat accumulation in at least one heat affected zone, and corresponding secondary pulses overlap with said heat affected zone, in such a way that due to energy (heat) accumulated and "pre-heated" (heat affected zone), secondary pulse induced ablation and energy absorption becomes much more efficient. The "pre-heating" and subsequent ablation causes the appearance of damage structures on the surface of said substrate layer, whereby said damage structures function as the precursor for the large fractures and cracks (extending into the depth of the substrate layer) that are produced by a heat gradient and rapid nonuniform cooling. The said cracks and fracture are produced by tensions in bulk of said layer material in the separation plain along the scribing trajectory.

DESCRIPTION OF DRAWINGS

In order to understand the method better, and appreciate its practical applications, the following pictures are provided and referenced hereafter. Figures are given as examples only and in no way should limit the scope of the invention.

DETAILED DESCRIPTION OF PREFERRED EMBODIMENTS

This invention provides a laser processing method for separating semiconductor devices formed on a single substrate containing at least one layer of hard and brittle material, preferably SiC. During preparation of a sample for the dicing/cleaving/breaking procedure a bulk damage structure is achieved that helps to divide the workpiece along the intended separation planes with minimal defects (separation of scribed wafer into dies or chips techniques should be known to a person skilled in the art).

In the most preferred embodiment, workpiece comprises a main substrate layer of Silicon carbide, 4H polytype (4H—SiC) (other variations can also be used), with a metal, semiconductor or dielectric coating. The workpiece has a first and second parallel surface. The pulsed laser beam source provides radiation in with a wavelength of in the range from near UV-mid IR spectral range (for example 515 or 1030 nm), with a pulse duration less than 1 ps, preferable in the range of 200 to 500 fs (FWHM/1,41). The initial beam is guided beam manipulation assembly, for example featuring at least two optical beam splitters, and a temporal delay line (two slidable mirrors). The first beam splitter separates the initial beam into the primary and secondary pulsed beams, whereas the second beam splitter combines said beams on a single optical path, after a controlled temporal delay between the primary and secondary pulses has been introduced. It should be apparent to a person skilled in the art that the beam manipulation assembly can be arranged in a multiple of ways in order to produce said primary and secondary pulses.

Figure 1:
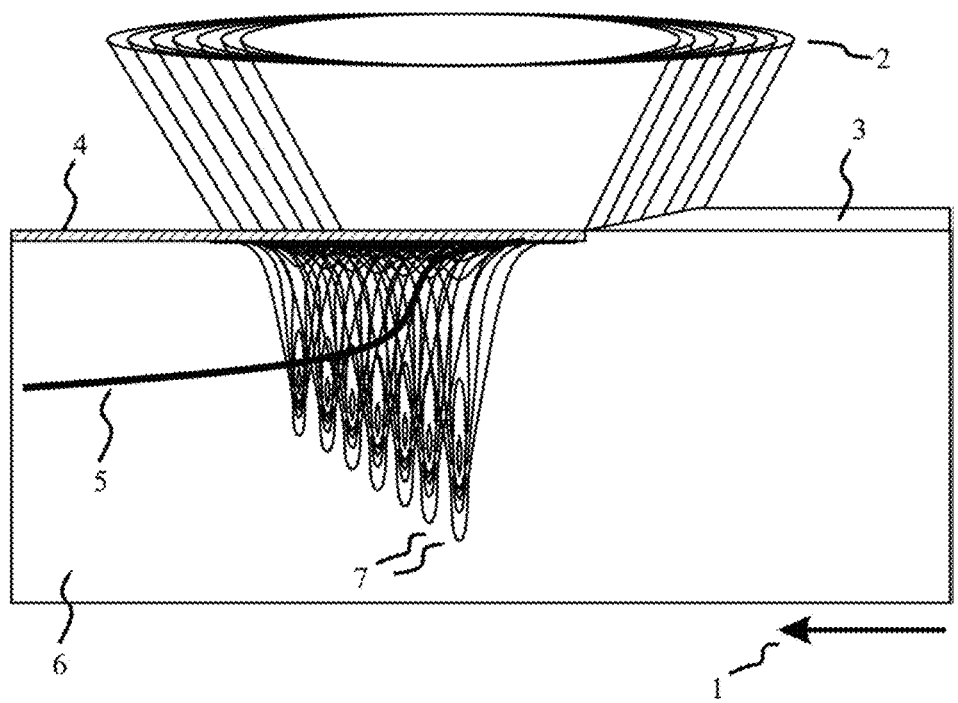
FIG. 1 illustrates the real time changes on the surface of the process workpiece, while being process with a two pulse-pair configuration. The workpiece is being linearly translated in the direction 1.

Both pulsed beams are directed through a beam converging means (focusing mirror, objective lens, and etc.) having a preferred numerical aperture in the range of 0.1 to 0.4, into the intended scribing area along at least one scribing trajectory. Such case is illustrated in FIG. 1, whereas the primary and secondary beam 2 are converged onto the surface of the workpiece sample.

Figure 2:
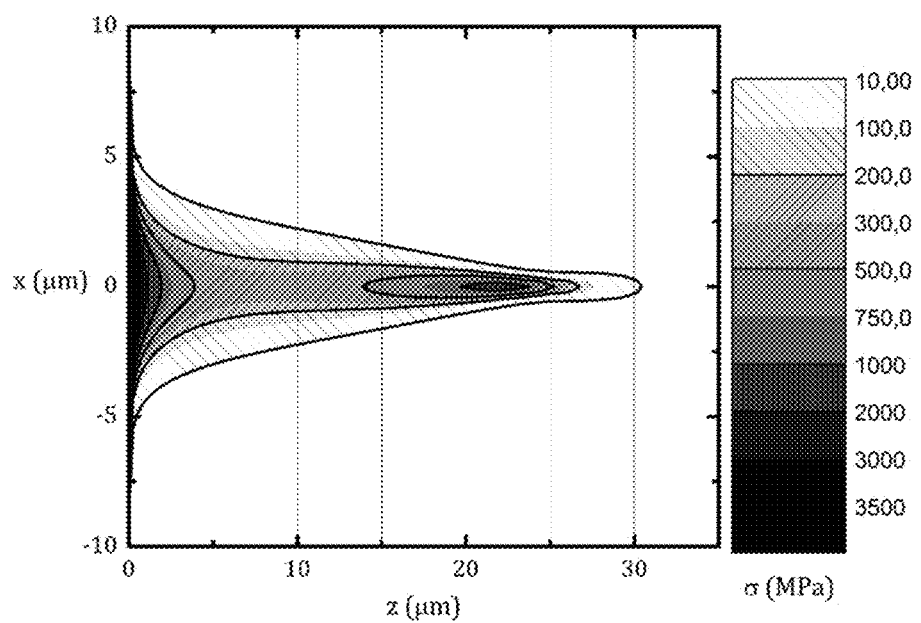
FIG. 2 illustrates tensions created in a volume as a consequence of a single pair of primary and secondary pulses energy absorption by SiC substrate.

The workpiece is linearly translated, in such a way that primary and secondary pulses are delivered into the intended scribing area in pulse packages of 2 to 8 pulses per micrometer. Each primary pulse is accompanied by at least one corresponding secondary pulse delayed by a shorter time interval slightly exceeding electron-phonon relaxation time of the main substrate material, in the preferred case delayed by half the pulse repetition period of the initial laser source, for example set at a frequency of 200 kHz. In other cases it should be selected in range of 10 to 1000 ps. The primary pulses delivered onto the scribing area are used to initiate and maintain surface, which can correspond to functional layer 3 or system of layers deposited on the main substrate layer, ablation and heat accumulation (by depositing additional heat—"pre-heating"). Also, the primary pulses initiate small physical changes on the surface of said substrate layer, which result in a reduced damage threshold for stress induced mechanical failures, thus forming a crack or fracture precursor 4. Since the pulse duration is selected to be in a femtosecond scale and the time interval between arrivals of secondary pulses is comparable to the electron-phonon relaxation time of SiC, a localized at least one heat affected zone is formed. For consequent pulses ablation and energy absorption becomes much more efficient in the confines of said heat-affected zone. Corresponding secondary pulses that arrive after each consecutive primary pulse overlap with said heat affected zone, in such a way that a sufficiently steep heat gradient and rapid nonuniform cooling producing high tensions in the bulk of substrate material, and a damage structure 5—system of extending mechanical failures, extending from the surface of the substrate layer appears. It should be understood that the secondary pulses serve not only for heat deposition in the heat affected zone, but also can support the ablation process of the substrate surface and coatings 3. Also, since the principles of such processing method are based on the accumulative effect of more than one pulse, a primary pulse can function as a secondary pulse for a succeeding primary pulse. The process is illustrated if FIG. 1, incoming pulsed-beams delivering pulse pairs 2, coating layer 3, semiconductor substrate 6, crack precursor 4, approximate fracture growth bottom edge line 5, primary and secondary pulse pair created single tension profiles 7 (profile pairs for pule pairs), workpiece movement direction 1 are shown. Tensions created in a volume as a consequence of a single pair of primary and secondary pulses energy absorption by SiC substrate are shown in FIG. 2. For best result the processing pulse energies must be selected in the range 4 to 50 µJ.

In another preferred embodiment, said at least one primary and secondary pulsed beams are guided through beam manipulation elements in the beam manipulation assembly, wherein at least one pulsed beam parameters are modified, such as wavelength, pulse duration, pulse temporal envelope shape or spectrum, beam divergence, spatial spectrum, temporal or spatial phase modulation or similar.

In another preferred embodiment, said primary and secondary pulsed beams are set to be of identical beam parameters.

In another preferred embodiment, the workpiece comprises a substrate layer and two or more coating layers of different materials.

In another embodiment, the primary pulsed beam is focused onto the first surface or below—convergence point or focal point is placed/formed below the first surface of the workpiece) of the workpiece ablating the coating layers, wherein the coating layer thickness is reduced or completely removed uncovering said at least one hard and brittle substrate layer, and a heat affected zone is created and the secondary pulse laser beam converging point is place below the first surface of the workpiece.

In another embodiment, the secondary pulsed beam is modified to be of increased divergence before being focused into intended scribing area, in such a way that in focal point is placed below the focal point (or beam convergence points) of the primary pulsed beam and overlaps with said heat affected zone increasing the amount of heat deposited due to multiphoton absorption, as the multiphoton absorption cross section coefficient increases with the increase of material temperature.

In another embodiment, the workpiece at lease one substrate layer material is Gallium Nitride.

In another preferred embodiment, the workpiece comprises a substrate layer and two or more coating layers of different materials, further processing beams are generated, for removing gradually removing said layers and creating the heat accumulation zone gradually.

In another preferred embodiment, the workpiece comprises nonplanar surfaces and during the processing procedure a constant distance between the workpiece first surface and converging means is actively maintained.

Figure 3:
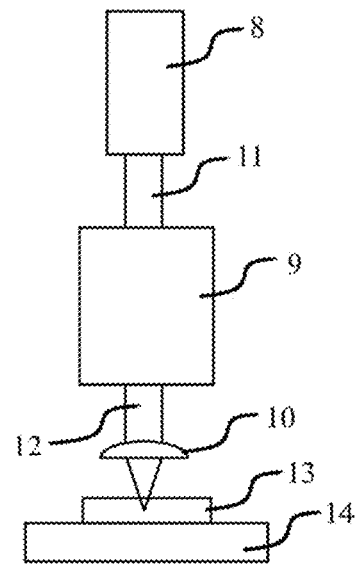
FIG. 3 illustrates a generalized basic laser processing setup necessary for realizing the disclosed method.
Figure 4:
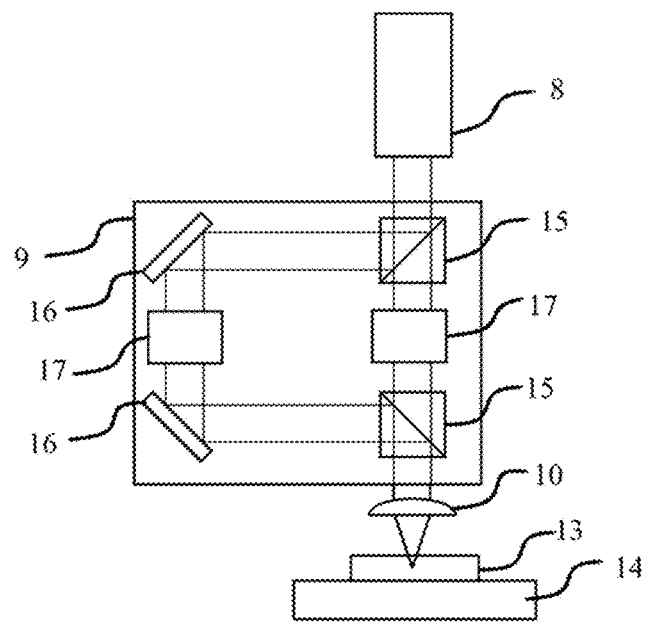
FIG. 4 illustrates a specific processing setup necessary for realizing the disclosed method.

For a person skilled in the art to be able to properly realize the disclosed invention, FIG. 3 and FIG. 4 are provided. FIG. 3 shows a simple most general system required to produce the results associated with the disclosed method, in which a pulsed laser source 8 is used to provide the initial pulsed beam 11 that is guided through the generalized beam manipulation assembly 9 in which splitting of pulsed laser beam occurs, and a delay between at least primary and secondary pulses is introduced. As the at least one primary and one secondary pulsed beams are guided out of the said pulsed beam manipulation assembly 9, they are guided through a beam converging means 10. The beam converging means can be a spherical lens, an aspherical lens, an objective lens, or a curved mirror focusing mirror. It should be note that the initial pulsed beam 11 inside the beam manipulation assembly must be divided as to produce two or more resulting primary, secondary and so on, pulses, since the processing pulses which are contained in the at least one primary and secondary processing beam 12 are produced in pairs or bundles of pulses. Also the according to the method the processing beams 12 or the workpiece 13 or both must be translated in the transverse direction, the most simple way of achieving this is mounting the workpiece 13 on a motorized linear translation stage complex 14 during processing or by displacing the processing system itself, or by using a galvanometric scanner and etc.

FIG. 4 illustrates how an exemplar beam manipulation assembly should be selected for the process, wherein the initial pulsed beam 11 is split in a pulsed beam manipulation assembly 9, containing two beam splitters 15, and a delay line comprised of at least two displaceable mirrors 16, which can be replaced by a displaceable rooftop type reflector or dielectric prism, as they these are standard solutions known in the art. Other solution including the use of electro-optic modulator, acousto-optic modulator, diffractive optics, elements made from use birefringent materials can be used to separate and delay said pulses without removing them from the main optical axis of the initial pulsed beam 11. Also at least one beam manipulation element or device 17 might be included in the respective optical path for changing pulsed beam parameters, such as wavelength, pulse width, temporal envelope, spatial intensity distribution or phase modulation, divergence, polarization, of at least one separated pulsed beams. The manipulation element 17 can be a diffraction element for splitting the beam into multiple parallel beams, a phase plate, nonlinear harmonic generation crystal, focusing or defocusing lens, liquid crystal phase modulator, adaptive optics element or any other element to change the spatial, temporal or spectral properties of said at least one pulsed beams. Also, the beam manipulation assembly and converging means can be integrated into a single device.

In order to better disclose the present invention the following examples are provided. Nonetheless, the disclosed examples and the mentioned parameters are provided to help understand the invention better and in no way limit its extent. These parameters can be changed in a wide interval, reproducing similar or different results, yet the main concept of the dicing process remains the same.

Example 1

Figure 5:
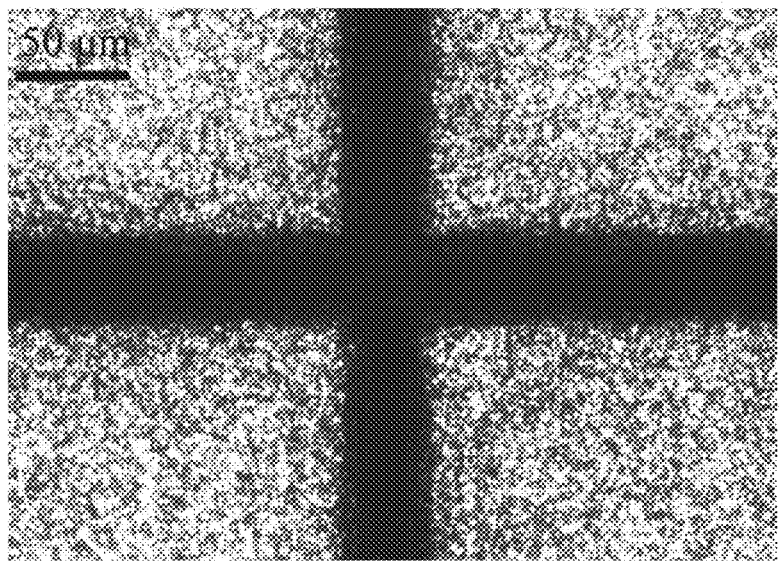
FIG. 5 illustrates a surface of a gold coated substrate that has been scribed.
Figure 6:
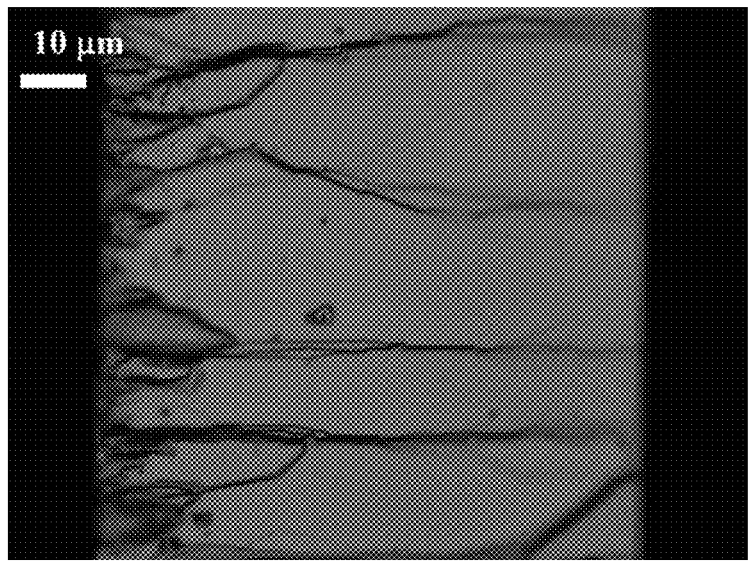
FIG. 6 is a side view of gold coated substrate after cleaving.

Workpiece substrate material is SiC (4H—SiC) with a single metal coating of gold. Primary and secondary pulse energy equally combined is 10 mikrojoules. The laser source is a femtosecond laser having an output radiation wavelength 1030 nm, pulse width below 300 fs (full width at half maximum/1.41), set at an output frequency of 200 kHz. Both primary and secondary beams are altered with non-linear second harmonic generation crystal to be of 515 nm wavelength. Primary and secondary pulses are set with a delay of 100 ps. The focusing unit is arranged with a 0.15 NA focusing objective lens, as the beam converging means, with a focal length of 15 mm. Linear workpiece translation speed is set to 100 mm/s. Result of such processing are summarized in FIG. 5 and FIG. 6.

The invention claimed is:
1. A semiconductor workpiece laser scribing method,
wherein the workpiece comprises at least one substrate layer of a hard and brittle material having a bandgap in the range of 2.5 to 4 eV,
wherein the workpiece has a first and second parallel surface,
wherein a pulsed beam laser source is used, whereas at least one of the workpiece or a processing laser beam originating from the pulsed laser source is are relatively translated along an intended scribing trajectory, characterized in that
the pulsed laser beam is guided through a beam manipulation assembly, arranged to separate an initial beam from the pulsed beam laser source,
wherein the initial beam is divided into at least one primary pulsed beam containing primary pulses and one secondary pulsed beam containing secondary pulses, after which the beams are delivered through a beam converging means onto and into the workpiece along the intended scribing trajectory,
whereas the primary and secondary pulses are delivered into the intended-scribing trajectory in pulse packages of 2 to 8 pulses per micrometer,
whereas each primary pulse is accompanied by at least one corresponding secondary pulse, which is delayed by a time interval which slightly exceeds electron- phonon relaxation time of said at least one substrate layer material, in such a way that the primary pulses in the intended scribing trajectory initiate and maintain surface ablation and heat accumulation in at least one heat affected zone, and corresponding secondary pulses overlap with said heat affected zone, in such a way that due to a heat gradient and rapid nonuniform cooling produces cracks and fractures extending from the said at least one substrate layer surface into the depth of the substrate along the intended scribing trajectory.

2. The semiconductor workpiece laser scribing method according to claim 1, characterized in that said at least one from at least one primary and at least one secondary pulsed beams is modified inside the beam manipulation assembly, wherein the modification includes changing of at least one of pulse beam parameters, comprising at least one of: wavelength, pulse duration, pulse temporal envelope shape/spectrum, beam divergence, polarization, spatial spectrum, temporal or spatial phase distribution.

3. The semiconductor workpiece laser scribing method according to claim 1, characterized in that said primary and secondary pulsed beams are set to be of identical beam parameters.

4. The semiconductor workpiece laser scribing method according to claim 1, characterized in that the first surface of said substrate may contain one or more coating layers of different materials.

5. The semiconductor workpiece laser scribing method according to claim 1, characterized in that the pulsed beam laser source emits radiation with wavelength within the range of near UV to near IR and pulse duration in the range of 200 to 1000 fs.

6. The semiconductor workpiece laser scribing method according to claim 1, characterized in that said at least one primary and secondary pulse energies in the range of 4 to 50 µJ.

7. The semiconductor workpiece laser scribing method according to claim 4, characterized in that said primary pulsed beam is focused onto or below the first surface of the workpiece ablating the one or more coating layers, wherein the coating layer thickness is reduced or completely removed uncovering said at least one hard and brittle substrate layer, and creates the heat affected zone.

8. The semiconductor workpiece laser scribing method according to claim 1, characterized in that said secondary pulsed beam is modified to be of increased divergence before being focused into the intended scribing trajectory, in such a way that the beam convergence point of said secondary pulse beam is placed below the beam convergence point of the primary pulsed beam and overlaps with said heat affected zone increasing the amount of heat deposited due to multiphoton absorption in bulk of said substrate layer.

9. The semiconductor workpiece laser scribing method according to claim 1, characterized in that said workpiece comprises at least one substrate layer material of Silicon Carbide or Gallium Nitride.

* * * * *